United States Patent [19]

Blome

[11] Patent Number: 4,679,689
[45] Date of Patent: Jul. 14, 1987

[54] PROCESSING, SHIPPING AND/OR STORAGE CONTAINER FOR PHOTOMASKS AND/OR WAFERS

[75] Inventor: Eugene R. Blome, San Jose, Calif.

[73] Assignee: General Signal Corporation, Stamford, Conn.

[21] Appl. No.: 771,871

[22] Filed: Sep. 3, 1985

[51] Int. Cl.[4] .............................................. B65D 85/48
[52] U.S. Cl. .................................. 206/334; 206/453; 206/454; 206/522
[58] Field of Search ................ 206/522, 454, 334, 453

[56] References Cited

U.S. PATENT DOCUMENTS

| | | | |
|---|---|---|---|
| 1,457,496 | 6/1923 | Butler | 206/522 |
| 3,346,101 | 10/1967 | Pestka | 206/522 |
| 4,091,919 | 5/1978 | MacLeod et al. | 206/454 |
| 4,520,925 | 6/1985 | Johnson | 206/454 |
| 4,557,382 | 12/1985 | Johnson | 206/454 |
| 4,588,086 | 5/1986 | Coe | 206/454 |

Primary Examiner—Joseph Man-Fu Moy
Attorney, Agent, or Firm—Ronald Reichman

[57] ABSTRACT

This invention pertains to a system for holding Photomasks and/or wafers in a clean environment during processing, shipment and/or storage. The apparatus of the invention comprises a processing holder that may be used for the internal processing of photomasks and/or wafers, as well as being used as the inner portion of a photomask and/or wafer shipping and storage container.

14 Claims, 10 Drawing Figures

PROCESSING, SHIPPING AND/OR STORAGE CONTAINER FOR PHOTOMASKS AND/OR WAFERS

BACKGROUND OF THE INVENTION

This invention relates to devices for carrying and shipping integrated circuits, and more particularly to a device that may be used in the processing and shipment of wafers and/or photomasks.

DESCRIPTION OF THE PRIOR ART

During the past few decades, electronic technology has been advancing at a rapidly accelerating rate. To a large extent, this advancement is due to the improved ability to manufacture miniature electronic circuitry. Miniature circuitry permits very complicated systems such as powerful computers to have manageable physical dimensions, lower per unit cost and greater reliability.

The cost of processing a miniature circuit or integrated circuit, whether it holds a single transistor or a hundred transistors is roughly proportional to its area. The reason for the above is that approximately the same numbers of manufacturing steps are involved in producing an integrated circuit having a large area as providing an integrated circuit having a small area. Hence, by placing more electrical components into less integrated circuit areas, the cost per component is reduced.

Photomasks and/or silicon wafers are used during the manufacture of integrated circuits. A photomask is a transparent material that is used to produce an image which represents a plurality of electronic circuits that are transferable to a silicon wafer. The pattern that appears on the photomask will appear on the wafer so that the resistivity of the silicon wafer will be changed during subsequent manufacturing processes to produce a plurality of electronic circuits.

During the processing of photomasks and/or wafers, the photomasks and/or wafers were placed in a plate carrier so that they would be able to be transported from one location to another within a fabrication facility. The plate carrier usually had a wedge-shaped base containing slots that held the edges of the photomask or wafer. The slots were usually positioned 15° off normal to make it easier to clean the photomasks and wafers. An example of a prior art plate carrier is the Model No. A-20-01 plate carrier manufactured by Fluoroware, Inc. of Jonathan Industrial Center, Chaska, Minn. 55318.

Another plate carrier manufactured by Fluoroware was the Model No. A77 plate carrier. The A77 plate carrier was rectangularly shaped and had grooves on its sides and base for the holding of photomasks and wafers.

Some of the disadvantages of the aforementioned plate carriers were that the use of these carriers tended to cause wafer and photomask edge abrasion. The edge abrasion was usually caused by the movement of the photomask and wafer within the slots. The chipping of the edges of the photomasks and wafers increased the generation of dirt which caused imperfections in the photomasks and wafers. This reduced the yield of the manufactured integrated circuits.

Photomasks and/or wafers were individually removed from the plate carrier and placed in a shipping container for shipment from one facility to another. The shipping container was usually shaped like a rectangular box and this same container was used for the storage of the wafers and photomasks. Shipping containers were usually rectangular boxes that contained slots which held the wafers and/or masks within the boxes. The slots were perpendicular to the base of the container. An example of a prior art shipping container is the Fluoroware Model No. E94-50-101.

Some of the disadvantages of the aforementioned shipping containers are that when the photomasks and/or wafers were placed in the container they moved the air around them, which caused a shearing force. This shearing force usually caused the generation of dirt, which reduced the yield of the manufactured integrated circuits. The placement of the wafers and/or photomasks within the shipping container also caused edge abrasion.

SUMMARY OF THE INVENTION

This invention overcomes some of the disadvantages of the prior art by providing a processing holder that may be used for the internal processing of photomasks and/or wafers as well as being used as the inner portion of a photomask and/or wafer shipping and storage container. Thus, the photomasks and/or wafers would not be handled as often and they would be less likely to be damaged. The apparatus of this invention would also reduce the amount of edge abrasion and dirt that the photomasks and/or wafers are subjected to by holding the photomasks and/or wafers more securely so that they would not rattle, chip and generate dirt when they are moved from one location to another.

It is an object of this invention to provide a new and improved device for securely holding photomasks and/or wafers during internal processing within a fabrication facility to reduce photomask and/or wafer edge abrasion and limit the generation of dirt.

It is another object of this invention to provide a new and improved device for securely holding photomasks and/or wafers during shipment from one location to another, to reduce photomask and/or wafer edge abrasion and limit the generation of dirt.

It is a further object of this invention to provide a new and improved device that may be used during the internal processing of photomasks and/or wafers within a fabrication facility and used for the shipment and/or storage of photomasks and/or wafers.

Further objects and advantages of this invention will become more apparent as the following description proceeds, which invention should be considered together with the accompanying drawings.

DESCRIPTION OF A PREFERRED EMBODIMENT

Figure 1:
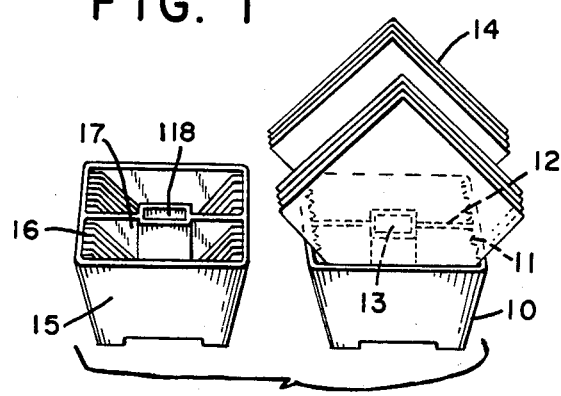
FIG. 1 is a perspective representation showing the top and bottom sections of the processing holder portion of this invention.

Referring now to the drawings in detail, and more particularly to FIG. 1, the reference character 10 represents a tray that has a plurality of grooves 11, a wall 12 that divides tray 10 into two equal halves, and a slot 13 that is in the center of wall 12. Tray 10 may be used as a processing and/or inspecting holder for inspecting and/or processing the photomasks or wafers 14 that are placed in grooves 11.

Tray 15 has a plurality of grooves 16, a wall 17 that divides tray 15 into two equal halves and a slot 18 that is in the center of wall 17. Hence, tray 15 is identical to tray 10. Thus, while the wafers and/or photomasks 14 are being processed or inspected, wafers and/or photomasks 14 may be moved from one tray to another. Tray 10 may be used as a bottom section of a holder to hold the bottom edges of wafers and/or photomasks 14 while tray 14 is used as a top section of a holder to support the top edges of wafers 14.

Figure 2:
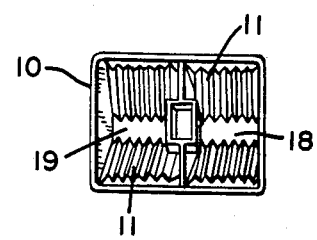
FIG. 2 is a perspective representation showing one of the sections of FIG. 1 rotated so that the grooves may be more easily seen.

FIG. 2 shows tray 10 from another angle so that grooves 11 will be more conspicuous and gaps 18 and 19 will be seen. Gaps 19 exist so that during processing, chemicals will be able to run off substrate 14, and during shipment and storage of wafers 14, there will be less tray material that may cause edge abrasion.

Figure 3A:
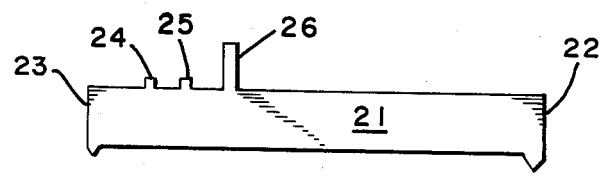
FIGS. 3a and 3b are diagrams of the device that holds the top and bottom section of the device shown in FIG. 1 together.
Figure 3B:
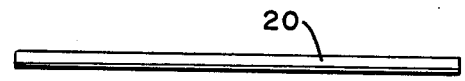

FIG. 3 shows a rod 20 and a coupling device 21 that are used to connect tray 10 to tray 15 so that tray 10 and tray 15 will hold wafers 14 firmly in place. Coupling device 21 has a bottom end 22 and a top end 23. Rod guides 24 and 25 and holder 26 are on one of the sides of device 19.

Figure 4:
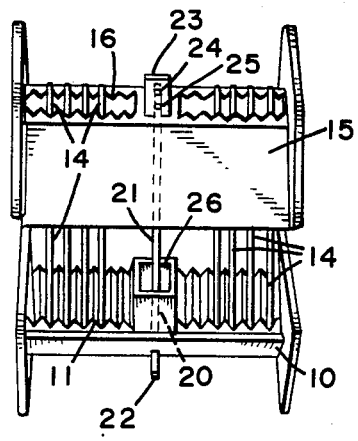
FIG. 4 is a perspective representation showing the top and bottom sections of the processing holder of FIG. 1 assembled.

FIG. 4 shows coupling device 21 and rod 20 connecting tray 10 having a plurality of grooves 11 to tray 15. Tray 15 is connected to tray 10 by gently placing the top edges of substrate 14 in grooves 16; inserting end 23 of device 21 into slots 18 and 13 so that end 23 will rest against the bottom of slot 13; and inserting rod 20 through rod guides 24 and 25 and holder 26.

Figure 5:
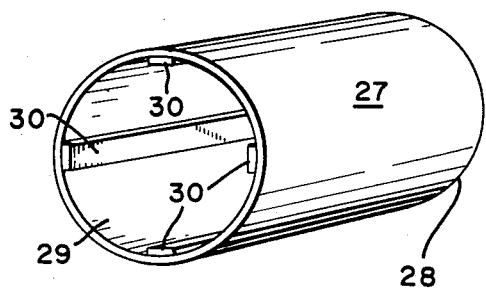
FIG. 5 is a perspective representation showing part of the shipping and/or storage container that the processing holder of FIG. 4 is inserted into for shipment and/or storage.

FIG. 5 shows a portion of shipping and/or storage container 27. Container 27 is cylindrically shaped to reduce the accumulation of dirt and has ends 28 and 29. A plurality of inflatable diaphragms 30 running from end 28 to end 29 are connected to the inside surface of container 27. Once trays 10 and 15 have been connected by the method described in the description of FIG. 4, trays 10 and 15 may be inserted into end 28 or end 29 of continer 27. After trays 10 and 15 are inserted into container 27, diaphragms 30 will touch the edges of wafers trays 10 and 15.

Figure 6:
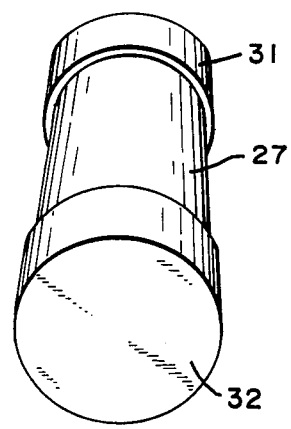
FIG. 6 is a perspective representation of the shipping and/or storage container.

FIG. 6 shows caps 31 and 32 securing the ends of container 27. When caps 31 and 32 seal the ends of container 27, the pressure within container 27 will be reduced, i.e., a partial vacuum will exist within container 27. The aforementioned reduction in pressure will cause diaphragms 30 to inflate and pinch the edges of trays 10 and 15(not shown) so that substrates 14 will be securely held within container 27. Thus, diaphragms 30 will act as shock absorbers reducing any possible damage that might occur to substrates 14 when they are moved from one location to another. Hence, container 27 may be used as a storage container and/or a shipping container.

Figure 7:
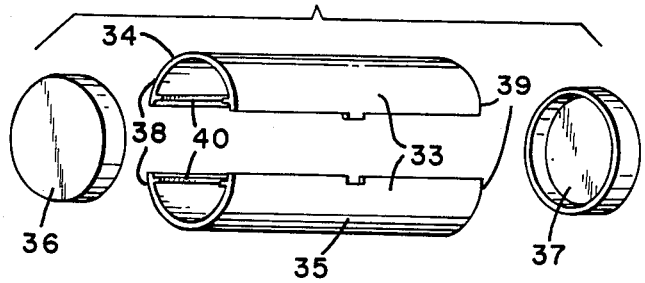
FIG. 7 is a perspective representation showing an alternate embodiment of a shipping and/or storage container.

FIG. 7 shows an alternate embodiment of the shipping and/or storage container shown in FIG. 5. Cylindrically shaped container 33 has ends 38 and 39 and two identical halves 34 and 35. A plurality of inflatable diaphragms 40 running from end 38 to end 39 are connected to the inside surface of halves 34 and 35. Once trays 10 and 15 have been connected by the method described in the description of FIG. 4, trays 10 and 15 may be inserted into half 35. Half 34 will be placed over trays 10 and 15 (not shown) so that locking mechanism 41 will secure half 34 to half 35 to form cylindrical shipping and/ or storage container 33. Cap 36 will be placed over end 38 and cap 37 will be placed over end 39. When caps 36 and 37 seal the ends of container 33, the pressure within container 33 will be reduced, causing diaphragms 40 to inflate and hold substrates 14 (not shown) securely within container 33. Thus, diaphragms 40 will act as shock absorbers reducing any possible damage that may occur to wafers 14 when they are moved from one location to another. One of the advantages of container 33 is that the edges of substrates 14 are less likely to be damaged when substrates 14 are inserted or removed from container 33.

Typically, containers 33 and 27 would be manufactured from a plastic or a reduced static metallic material. However, in order to make it easier to inspect the light-sensitive wafers and/or photomasks that are stored and/or shipped in containers 33 and 27, containers 33 and 27 may be made of material which transmits above 4500 A or 450 nonometer. The use of the above material would allow the wafers to be inspected under ordinary light without damaging the photosensitive wafers and/or photomasks. Thus, the wafers would not have to be brought to a special area and then removed from their container. Hence, the substrates would not be handled as often and they would less likely be damaged.

Photomasks and/or wafers are usually square or round and their sides usually vary in length or diameter, from 2 inches to 7.5 inches in 0.5 inch increments. Typically, a photomask substrate will be 60, 90, 120, 150, 180, or 250 mils thick and they would be packaged in lots of 5, 10, 20 or 30. Thus, in order to package and process all of the aforementioned sizes of photomasks and/or wafers, a large number of trays 10 and 15 must be kept in stock. Trays 10 and 15 require a considerable amount of storage space even when they are not holding photomasks and/or wafers.

Figure 8:
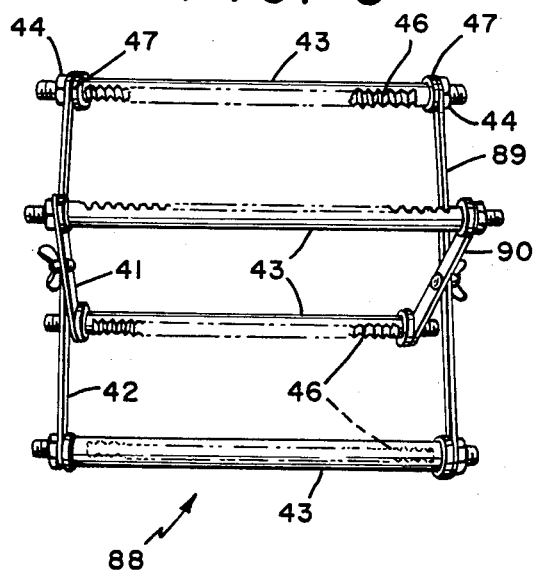
FIG. 8 is a perspective representation showing an alternate embodiment of the processing holder portion of this inveniton.

The alternate embodiment of a holder/carrier shown in FIG. 8 would permit all of the aforementioned varying sizes of photomasks to be placed in a processing and packaging holder 38 that consumes a minimum amount of space when it is disassembled and is not holding photomasks and/or wafers.

Holder 38 comprises four rods 43, spacer bars 39, 40, 41 and 42, eight nuts 44 and two lock nuts 45. Grooves 46 exist in rods 43 so that rods 43 may support and hold photomasks 11 (not shown). Each of rods 43 have two raised ends 47 and a threaded cylindrical section that is perpendicular to ends 47. Holder 38 is assembled by placing the holes (not shown) at the ends of spacer bars 39, 40, 41, and 42 over ends 47 so that nuts 44 may be tightened to hold spacer bars 39, 40, 41, and 42 against ends 47. Rods 43 will now be held at right angles to each other. Spacer bar 39 will be connected to spacer bar 40 and spacer bar 41 will be connected to spacer bar 42 by placing and tightening locking nuts 45 in the holes (not shown) of spacer bars 39, 40, 41, and 42.

The size of rods 43 and spacers 39, 40, 41, and 42 will depend upon the size of the photomasks and/or wafers they are holding. Hence, a different size rod 43 containing different groove depths will be used for different size photomasks and/or wafers. Rods 43 may be made of a plastic and/or metal material. However, when rods 43 are holding photomasks and/or wafers having a length greater than 4 inches, the plastic rods would usually have to be reinforced by a metal insert.

Holder 38 may be used as a processing holder for photomasks and/or wafers, and/or may be inserted into container 27, FIG. 6, container 33 or FIG. 7 for transporting the photomasks and/or wafers from one location to another.

Figure 9:
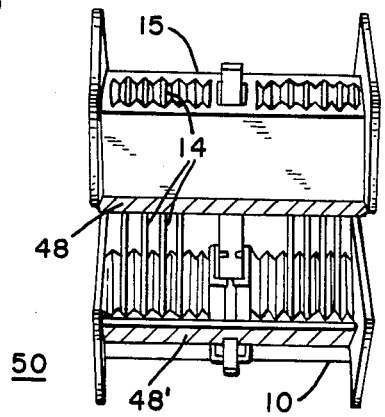
FIG. 9 is a perspective representation showing an alternate embodiment of the processing holder shown in FIG. 4.

FIG. 9 is an alternate embodiment of the holder shown in FIG. 4. The only difference between the holder shown in FIG. 4 and holder 50 of FIG. 9 is that inflatable diaphragms 47 are connected to two of the opposite sides of tray 10 (the opposite side of tray 10 is not shown) and inflatable diaphragms 48 are connected to two of the opposite sides of tray 15 (only 1 side is shown). Holder 50 and photomasks 14 may be placed in a container similar to containers 27 or 33 (that do not contain diaphragms 30 and 40) for the shipment of photomasks 14. After holder 50 is inserted into a container (not shown), and the ends of the container are sealed by caps (not shown), the pressure within the container will be reduced. The aforementioned reduction in pressure will cause diaphragms 47 and 48 to inflate and pinch the edges of trays 10 and 15 so that photomasks 14 will be securely held within the container. Thus, diaphragms 47 and 48 will act as shock absorbers reducing any possible damage that might occur to substrates 14 when they are moved from one location to another. Hence, container 50 may be used as a storage container and/or shipping container.

In order to give the contents of containers 27 and/or 33 additional protection, containers 27 and 33 may be placed in a preformed square foam package (not shown) that is vacuum sealed. The aforementioned foam acts as a shock mount and a thermal barrier to protect the photomasks and/or wafers residing in containers 27 and/or 33.

The above specification describes a new and improved processing holder and shipping container which may be used for the processing and/or shipment of photomasks and/or wafers. It is realized that the above description may indicate to those skilled in the art additional ways in which the principles of this invention may be used without departing from its spirit. It is therefore intended that this invention be limited only by the scope of the appended claims.

What is claimed is:

1. A system for holding photomasks and/or wafers in a clean environment during processing, shipment and/or storage of said photomasks and/or wafers said system comprises:

a first processing tray having grooves in which a lower portion of the edges of said photomasks and/or wafers are inserted, said first tray has an opening along its bottom surface permitting the escape of chemicals that are used in the processing of said photomasks and/or wafers;

a second processing tray having grooves, said second tray positioned above said first tray so that the grooves of said second tray will hold a upper portion of the edges of said photomasks and/or wafers, said second tray has an opening along its top surface so that said second tray may be used to permit the escape of chemicals that are used in the processing of said photomasks and/or wafers;

means for connecting said first tray to said second tray, so that said photomasks and/or wafers will be held firmly in place; and a container which contains one or more inflatable diaphragms connected to the inside surface of said container, in which said first and second trays and said means are inserted, whereby when said container is closed, said one or more diaphragms inflate causing said wafers and/or photomasks to be securely held within said first and second trays.

2. The system claimed in claim 1 wherein said first tray further includes:

a wall within said first tray, that divides said first tray into two compartments wherein a number of grooves are on each side of said wall; and a slot which exists within said wall.

3. The system claimed in claim 2 wherein said second tray further includes:

a wall within said second tray, that divides said second tray into two compartments wherein a number of grooves are on each side of said wall; and a slot which exists within said wall.

4. The system claimed in claim 3 wherein said means for connecting further includes:

a coupling device having one or more guides along its periphery; and a rod which, when inserted into said guides will connect said first tray to said second tray.

5. The system claimed in claim 4 wherein said coupling device further includes:

a member that has a bottom flanged surface that is inserted into the slot within said first tray;

a protrusion along the surface of said member which is inserted below the slot of said second tray; and a top end that rests above the slot of said second tray.

6. The system claimed in claim 5 wherein a handle is connected to said member so that said first and second trays may be carried by said handle.

7. The system claimed in claim 1 wherein said container is cylindrically shaped.

8. The system claimed in claim 7 wherein said container comprises a first section and a second section and means for connecting said first section to said second section.

9. The system claimed in claim 1 wherein said container is made of conductive glass filled polypropylene.

10. The system claimed in claim 7 wherein said container is made of black conductive glass filled polypropylene.

11. The system claimed in claim 8 wherein said container is made of black conductive glass filled polypropylene.

12. The system claimed in claim 1 wherein said holding means comprises:

four elements containing grooves for holding portions of the edges of photomasks and/or wafers, wherein said four elements are connected at right angles to each other by a locking means.

13. The system claimed in claim 12 wherein said locking means comprises a plurality of nuts and bolts.

14. The system claimed in claim 1 further including a preformed package in which said container is vacuum sealed.

* * * * *